(12) United States Patent
Oohira

(10) Patent No.: US 7,812,913 B2
(45) Date of Patent: Oct. 12, 2010

(54) DISPLAY DEVICE

(75) Inventor: Eiji Oohira, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 930 days.

(21) Appl. No.: 11/698,102

(22) Filed: Jan. 26, 2007

(65) Prior Publication Data

US 2007/0177093 A1    Aug. 2, 2007

(30) Foreign Application Priority Data

Jan. 27, 2006   (JP) .............................. 2006-019080

(51) Int. Cl.
  *G02F 1/1345*   (2006.01)
  *G02F 1/1333*   (2006.01)
  *H05K 1/00*     (2006.01)
(52) U.S. Cl. .................... 349/150; 349/58; 361/749
(58) Field of Classification Search ................. 349/150; 361/749
  See application file for complete search history.

(56) References Cited

U.S. PATENT DOCUMENTS

| 6,602,584 B2 * | 8/2003 | Jo et al. ..................... 428/209 |
| 7,432,998 B2 * | 10/2008 | Nishio et al. ................. 349/58 |
| 2002/0043400 A1 | 4/2002 | Shinohara |
| 2005/0078459 A1 | 4/2005 | Yeon |
| 2005/0190531 A1 | 9/2005 | Gall |

FOREIGN PATENT DOCUMENTS

| CN | 1607895 | 4/2005 |
| EP | 1768470 | 3/2007 |
| JP | 5-326643 | 12/1993 |
| JP | 2001-318618 | 11/2001 |
| JP | 2001331122 A | * 11/2001 |
| JP | 2003324255 A | * 11/2003 |
| JP | 2003324355 A | * 11/2003 |
| KR | 2002-0017965 | 3/2002 |
| WO | WO 2005/122656 | 12/2005 |

OTHER PUBLICATIONS

Machine translation of JP 2003-324255A.*
Machine translation of JP2001-331122A.*
Machine translation of JP2003-324233A; Nov. 2003.*
Machine translation of JP2001-331122A; Nov. 2001.*

* cited by examiner

*Primary Examiner*—David Nelms
*Assistant Examiner*—W. Patty Chen
(74) *Attorney, Agent, or Firm*—Antonelli, Terry, Stout & Kraus, LLP.

(57) ABSTRACT

The invention provides a display device which can suppress a bending repulsive force of a flexible printed circuit board having a folded portion thus reducing a manufacturing cost thereof. In a display device which includes a display panel, and a flexible printed circuit board which has one end thereof connected to a terminal portion of the display panel, the flexible printed circuit board includes a base member, a line layer which is formed on the base member using a metal layer, a surface protective cover which covers the line layer, and a folded portion, the line layer includes a signal line which supplies control signals or display data to the display panel and a dummy line, the signal line is covered with the surface protective cover at the folded portion, and the folded portion includes at least one exposed portion in which the dummy line is exposed from the surface protective cover ranging from a folding start point to a folding finish point.

12 Claims, 6 Drawing Sheets

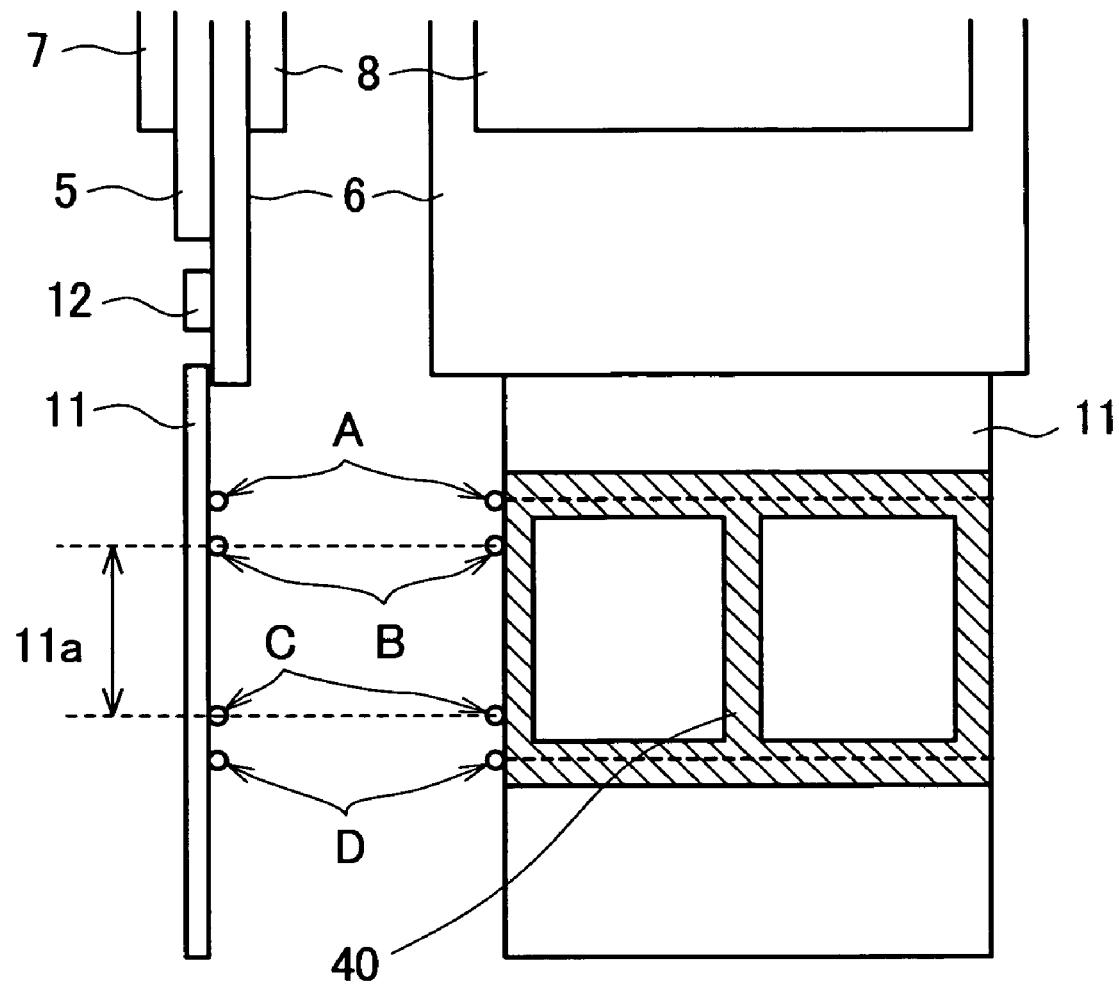

FIG. 8A Prior Art
FIG. 8B Prior Art
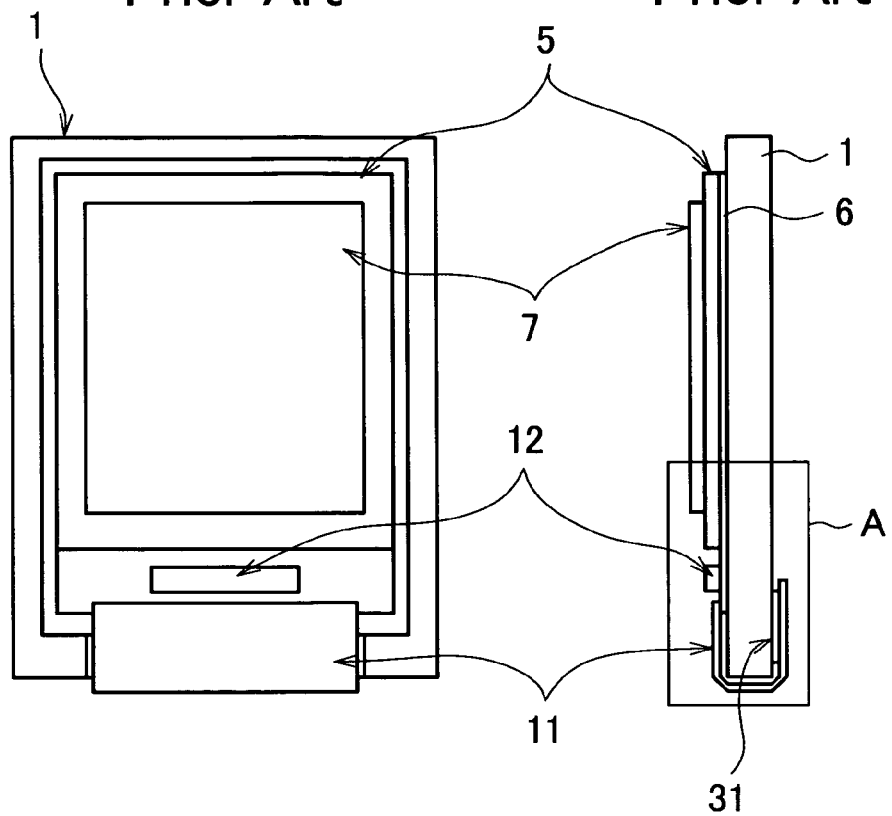
FIG. 9 Prior Art
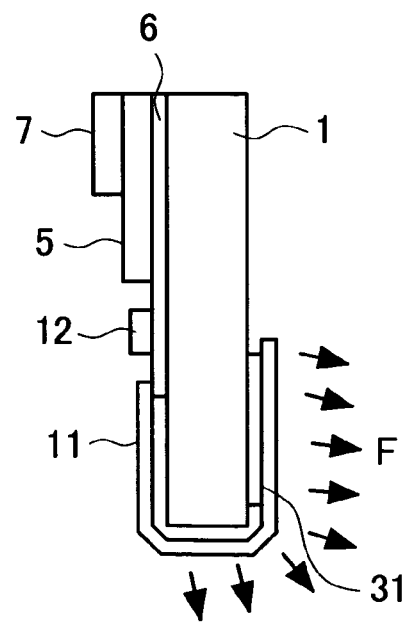

DISPLAY DEVICE

The present application claims priority from Japanese application JP2006-019080 filed on Jan. 27, 2006, the content of which is hereby incorporated by reference into this application.

BACKGROUND OF THE INVENTION

1. Field of the Invention

The present invention relates to a display device, and more particularly to a technique which is effectively applicable to a flexible printed circuit board for establishing an interface with an external device.

2. Description of the Related Art

A TFT (Thin Film Transistor) type liquid crystal display module which has a miniaturized liquid crystal display panel having sub pixels whose number is approximately 240×320×3 in color display has been popularly used as a display part of a portable equipment such as a mobile phone.

In general, the liquid crystal display module includes a liquid crystal display panel and a backlight which radiates light to the liquid crystal display panel, wherein in the liquid crystal display module which is used as a display part of a portable equipment such as a mobile phone, the backlight is constituted of a resin-mold frame (hereinafter referred to as a mold), a group of optical sheets and a light guide plate which are arranged in the inside of the mold, and a reflective sheet which is arranged below the light guide plate.

The liquid crystal display module for the mobile phone adopts, as a main stream, the structure in which a flexible printed circuit board which is connected with the liquid crystal display panel and establishes an interface with an external device has a portion thereof folded in a compact shape and fixed with a tape or fixed to a frame of a mold using a pressure sensitive adhesive double coated tape after being folded.

FIG. 8A and FIG. 8B are views for explaining a conventional liquid crystal display module for a mobile phone, wherein FIG. 8A is a view as viewed from above (a liquid crystal display panel side, a front face side, a viewer's side), and FIG. 8B is a view as viewed from a side surface.

The liquid crystal display panel is constituted of a pair of glass substrates (5, 6) which face each other with a liquid crystal layer sandwiched therebetween in an opposed manner, and an upper polarizer 7 and a lower polarizer (not shown in the drawing) which are adhered to the pair of glass substrates (5, 6), wherein a semiconductor chip 12 is mounted on the glass substrate 6. The liquid crystal display panel is mounted in the inside of the mold 1.

In the liquid crystal display module shown in FIG. 8A and FIG. 8B, to realize the miniaturization and the reduction in thickness, a flexible printed circuit board (hereinafter referred to as FPC) 11 is folded, and is pulled around and is fixed to a back surface side of a backlight. Further, on the FPC 11, electronic parts such as resistances and capacitors, and a white light emitting diode which constitutes a light source are mounted.

FIG. 9 is an enlarged view showing a portion A indicated by a solid line in FIG. 8B in an enlarged manner.

As shown in FIG. 9, when the liquid crystal display panel adopts the structure which pulls the FPC 11 around a back surface thereof from a terminal portion thereof with a minimum radius, as indicated by F in FIG. 9, the FPC 11 has a strong bending repulsive force (hereinafter referred to as a spring back force) and hence, the vicinity of a folded portion is fixed to the mold 1 using a pressure sensitive adhesive double coated tape 31.

As the prior art document related to the invention, a following document is named.

[Patent Document 1] JP-A-2001-318618

SUMMARY OF THE INVENTION

However, in the structure which pulls the FPC 11 which is connected with the liquid crystal display panel around a back surface of the backlight, when the FPC 11 is made of a hard material or has the small bending radius, a bending repulsive force of the FPC 11 is increased and hence, the FPC 11 is peeled off when an adhesive force of a pressure sensitive adhesive double coated tape 31 is weaker than the bending repulsive force of the FPC 11.

Accordingly, to suppress the bending repulsive force of the FPC per se, a soft material is used as a constitutional material of the FPC 11. However, even when a soft material is used as the constitutional material of the FPC 11, an effect to suppress the bending repulsive force of the FPC 11 is not favorably increased. Further, the selection of the soft material gives rise to a drawback that a manufacturing cost is pushed up.

The invention has been made to overcome the above-mentioned drawbacks of the related art, and it is an advantage of the invention to provide a technique which can, in a display device, suppress a bending repulsive force of a flexible printed circuit board having a folded portion and can reduce a manufacturing cost.

The above-mentioned and other advantages and novel features of the invention will become apparent from the description of this specification and attached drawings.

To briefly explain the summary of typical inventions among inventions disclosed in this specification, they are as follows.

(1) In a display device which includes a display panel and a flexible printed circuit board which has one end thereof connected to a terminal portion of the display panel, the flexible printed circuit board includes a base member, a line layer which is formed on the base member using a metal layer, a surface protective cover which covers the line layer, and a folded portion, the line layer includes a signal line which supplies control signals or display data to the display panel and a dummy line, the signal line is covered with the surface protective cover at the folded portion, and the folded portion includes at least one exposed portion in which the dummy line is exposed from the surface protective cover ranging from a folding start point to a folding finish point.

(2) In the constitution (1), 90% or more of an area of the signal line at the folded portion is covered with the surface protective cover.

(3) In the constitution (2), the whole area of the signal line at the folded portion is covered with the surface protective cover.

(4) In any of the constitutions (1) to (3), the total area of the exposed portion at the folded portion assumes 10% or more and 50% or less of an area of the folded portion.

(5) In any of the constitutions (1) to (4), a shape of the above-mentioned at least one exposed portion is arranged in the direction which intersects the folded portion.

(6) In any of the constitutions (1) to (5), gold plating is formed on a surface of the exposed portion.

(7) In any of the constitutions (1) to (5), solder is formed on a surface of the exposed portion.

(8) In any of the constitutions (1) to (7), the dummy line of the exposed portion assumes an electrically floating state.

(9) In any of the constitutions (1) to (7), a ground potential is supplied to the dummy line of the exposed portion.

(10) In any of the constitutions (1) to (9), a distance between a start point of the above-mentioned at least one exposed portion and the above-mentioned folding start point of the folded portion or a distance between a finish point of the at least one exposed portion and the above-mentioned folding finish point of the folded portion is set to 0.5 mm or more.

(11) In any of the constitutions (1) to (10), the display panel is a liquid crystal display panel, and a backlight is arranged on a back surface side of the liquid crystal display panel, and the flexible printed circuit board is folded at the folded portion and has a portion thereof arranged on the back surface side of the back light.

(12) In the constitution (11), the back light includes a frame-like mold, and the flexible printed circuit board is adhered to a back surface-side surface of the frame-like mold.

(13) In any of the constitutions (1) to (10), the flexible printed circuit board has another end thereof folded at the above-mentioned folded portion, and has a connector on a side closer to the above-mentioned another end than the folded portion.

(14) In a display device which includes a display panel and a flexible printed circuit board which has one end thereof connected to a terminal portion of the display panel, the flexible printed circuit board includes a base member, a line layer which is formed on the base member using a metal layer, a surface protective cover which covers the line layer, and a folded portion, and the folded portion has a metal plate which is adhered to the surface protective cover from a folding start point to a folding finish point.

To briefly explain advantageous effects obtained by the typical inventions among the inventions disclosed in this specification, they are as follows.

According to the display device of the invention, it is possible to suppress a bending repulsive force of the flexible printed circuit board having the folded portion thus reducing a manufacturing cost.

BRIEF DESCRIPTION OF THE DRAWINGS

FIGS. 7A and 7B are views for explaining a flexible printed circuit board (FPC) of an embodiment 2 of the invention;

FIGS. 8A and 8B are views for explaining a conventional liquid crystal display module for a mobile phone; and FIG. 9 is an enlarged view showing a portion A indicated by a solid line in FIG. 8B in an enlarged manner.

DESCRIPTION OF THE PREFERRED EMBODIMENTS

Hereinafter, embodiments of the invention are explained in detail in conjunction with drawings.

Here, in all drawings for explaining the embodiments, parts having identical functions are given same numerals and their repeated explanation is omitted.

Embodiment 1

Figure 1:
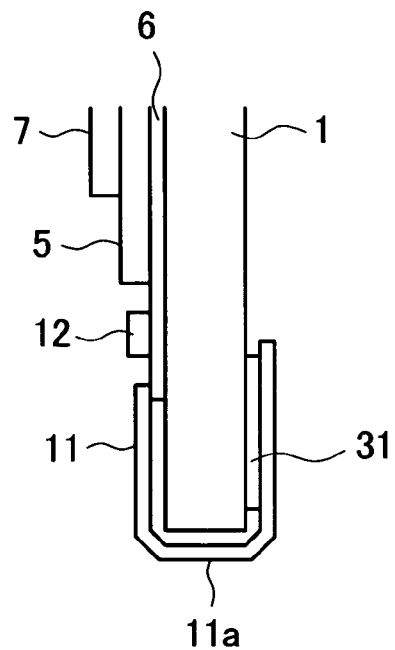
FIG. 1 is a side view of an essential part showing a liquid crystal display module of an embodiment 1 of the invention.

FIG. 1 is a side view of an essential part showing a liquid crystal display module of the embodiment 1 of the invention. Here, FIG. 1 is a view showing portions identical with the portions shown in FIG. 9.

The liquid crystal display panel of this embodiment is constituted of a pair of glass substrates (5, 6) which face each other with a liquid crystal layer sandwiched therebetween, and an upper polarizer 7 and a lower polarizer (not shown in the drawing because the lower polarizer is concealed by a mold 1) which are adhered to the pair of glass substrates (5, 6), wherein a semiconductor chip 12 is mounted on the glass substrate 6. The liquid crystal display panel is mounted in the inside of the resin mold frame (hereinafter simply referred to as the mold) 1.

Further, also in the liquid crystal display module of this embodiment, to realize the miniaturization and the reduction in thickness thereof, a flexible printed circuit board (hereinafter referred to as an FPC) 11 is folded, and is pulled around a back surface side of the backlight and has a portion thereof in the vicinity of the folded portion fixed to the mold 1 by a pressure sensitive adhesive double coated tape 31. Further, on the FPC 11, electronic parts such as resistances and capacitors, and a white light emitting diode which constitutes a light source are mounted.

Further, the FPC 11 includes a base member, a line layer which is formed on the base member using a metal layer, and a surface protective cover which covers the line layer. The line layer of the FPC 11 includes a signal line which supplies control signals or display data to the liquid crystal display panel. The signal line is covered with a surface protective cover.

Still further, the line layer of the FPC 11 also has a dummy line.

Figures 2A, 2B:
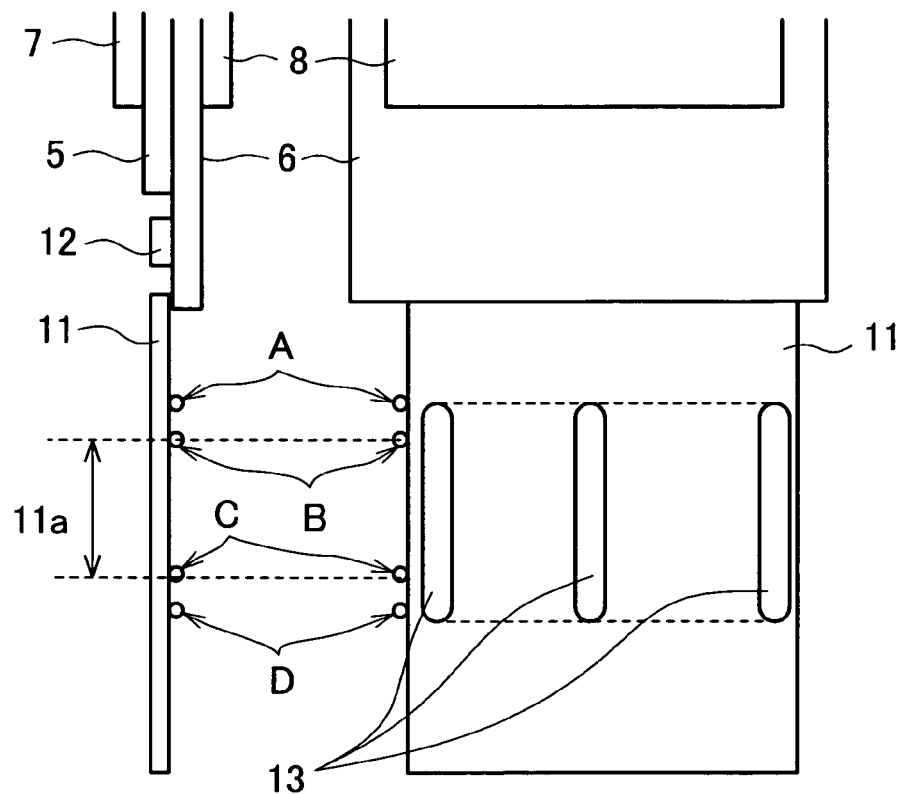
FIG. 2A and FIG. 2B are views for explaining a flexible printed circuit board (FPC) of the embodiment 1 of the invention.

FIG. 2A and FIG. 2B are views for explaining the FPC 11 of the embodiment, wherein FIG. 2A is a view as viewed from a side surface, and FIG. 2B is a view as viewed from a back surface side (a side opposite to the liquid crystal display panel or a side opposite to a viewer).

As shown in FIG. 2A and FIG. 2B, in this embodiment, three exposed portions 13 are formed on a folded portion 11a of the FPC 11. The exposed portions 13 are provided for exposing a metal layer (a dummy line layer) from the surface protective cover by removing the surface protective cover of the FPC 11.

Here, as shown in FIG. 2A and FIG. 2B, three exposed portions 13 are formed to include a distance from a folding start point (a point B in FIG. 2A and FIG. 2B) to a folding finish point (a point C in FIG. 2A and FIG. 2B). Here, a total area of three exposed portions 13 at the folded portion 11a is preferably 10% or more and 50% or less of the area of the folded portion 11a, and is more preferably 20% or more and 30% or less of the folded portion 11a. Due to such a constitution, it is possible to ensure a region where the signal line is formed other than the exposed portions 13.

Further, as shown in FIG. 2A and FIG. 2B, an opening shape of three exposed portions 13 (an opening shape of the surface protective cover) is arranged in the direction which intersects the folded portion 11a (longitudinal direction in FIG. 2B).

Still further, a length from a start point of three exposed portions 13 (a point A in FIG. 2A and FIG. 2B) to a finish point of three exposed portions 13 (a point D in FIG. 2A and FIG. 2B) is set larger than a length from the folding start point to the folding finish point such that the start point A of three exposed portions 13 is arranged outside the folding start point (the point B in FIG. 2A and FIG. 2B), and the finish point D of three exposed portions 13 is outside the folding finish point (the point C in FIG. 2A and FIG. 2B).

Figure 3:
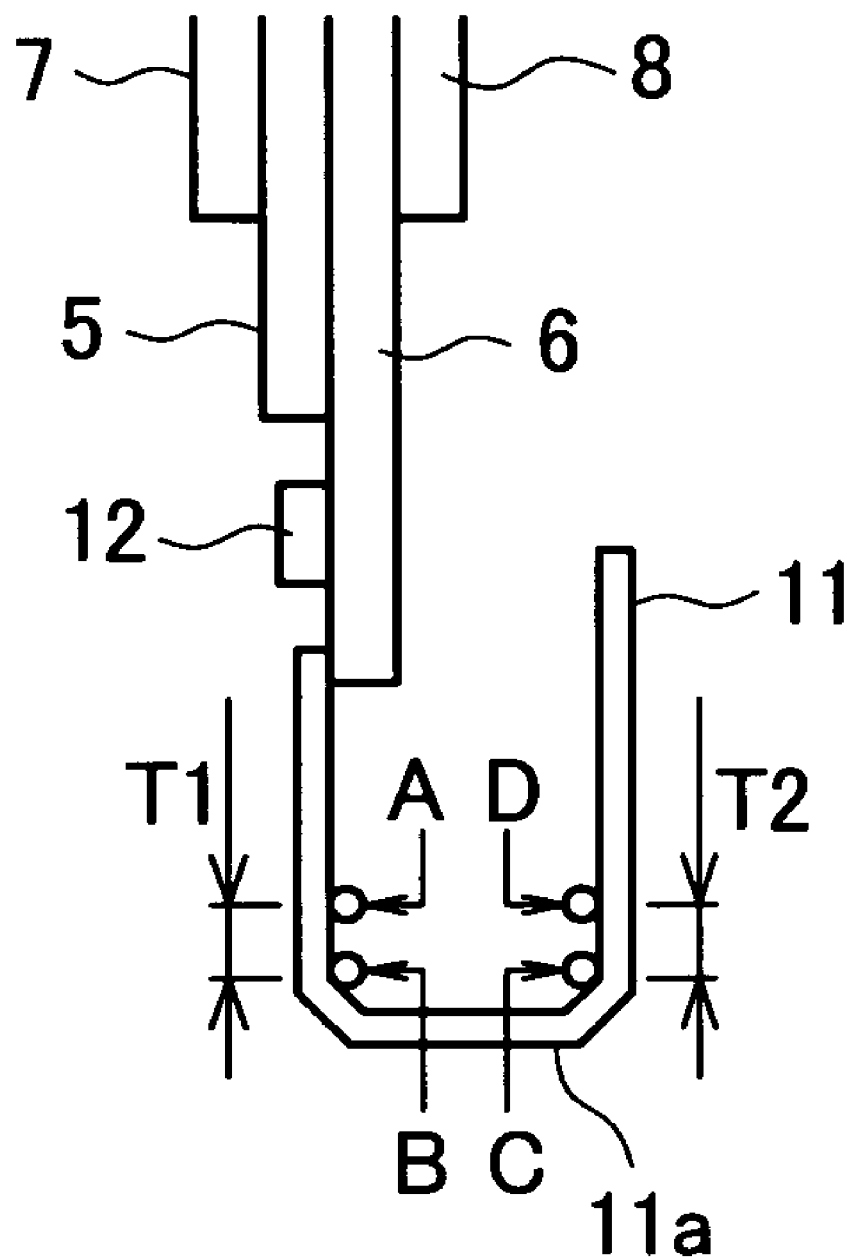
FIG. 3 is a view for explaining a length of an exposed portion shown in FIG. 2A and FIG. 2B.

Here, as shown in FIG. 3, it is desirable to set the distance (T1 in FIG. 3) between the start point (a point A in FIG. 3) of three exposed portions 13 and the folding start point (a point B in FIG. 3) and the distance (T2 in FIG. 3) between the finish point (a point D in FIG. 3) of three exposed portions 13 and the folding finish point (a point C in FIG. 3) to 0.5 mm or more. Here, in FIG. 2A, FIG. 2B and FIG. 3, numeral 8 indicates a lower polarizer.

Here, in the drawing, circular marks which are indicated at the point A to the point D are imaginary circular marks for facilitating the explanation of the invention.

In this manner, according to this embodiment, the dummy line (metal layer) is exposed from the surface protective cover by forming the exposed portions 13, that is, by removing the surface protective cover of the FPC 11 thus arranging a hard layer (the copper line which constitutes the dummy line layer or the copper plating line) on the folded portion 11a of the FPC 11.

Due to such a constitution, it is possible to generate an effect to increase plasticity thus weakening the resiliency (the bending repulsive force) of the FPC 11 at the folded portion 11a.

Here, the signal line is configured to be covered with the surface protective cover at the folded portion 11a. This is because that it is preferable that the signal line is covered with the surface protective cover in a region as large as possible to prevent corrosion of the signal line, to reduce signal noises and to protect the signal line. It is preferable that 90% or more of an area of the signal line at the folded portion is covered with the surface protective cover, and it is more preferable that the whole signal line at the folded portion is covered with the surface protective cover.

On the other hand, since the dummy line is not provided for transmitting the control signal and the display data, there arises no problem even when the dummy line is exposed from the surface protective cover. It is preferable to bring the dummy line into an electrically floating state or to supply a ground potential to the dummy line.

Here, in the above-mentioned patent document 1, there is described a technique which exposes a line (252) and dummy lines (254) at both sides by removing a surface protective cover (a cover lay 253) at a folded position of the flexible printed circuit board.

However, the technique described in the patent document 1 aims at the prevention of disconnection and does not aim at the suppression of the bending repulsive force of the flexible printed circuit board having the folded portion which the invention aims at. Accordingly, the invention differs from the technique described in the patent document 1 in objects.

Further, also with respect to the constitution, since the technique described in the patent document 1 aims at the prevention of disconnection, the exposure of the signal line (255) is a prerequisite. Further, with respect to the technique described in the patent document 1, the substantially whole area of the surface protective cover at the folded portion is removed to partially form concaves and convexes. That is, the technique described in the patent document 1 differs from the invention in which while covering the signal line with the surface protective cover at the folded portion, the surface protective cover on the portion of the folded portion is removed thus forming the exposed portions 13 of the dummy line. Further, in the technique described in the patent document 1, a shape of the exposed portions 13 is not arranged in the direction which intersects the folded portion 11a.

In this embodiment, surfaces of the exposed portions 13 may keep forming a copper line which constitutes the dummy line or a copper plating line thereon as it is, it is possible to increase the plasticity of the exposed portions 13 by forming gold plating or soldering on the surface of the exposed portion 13.

Figure 4:
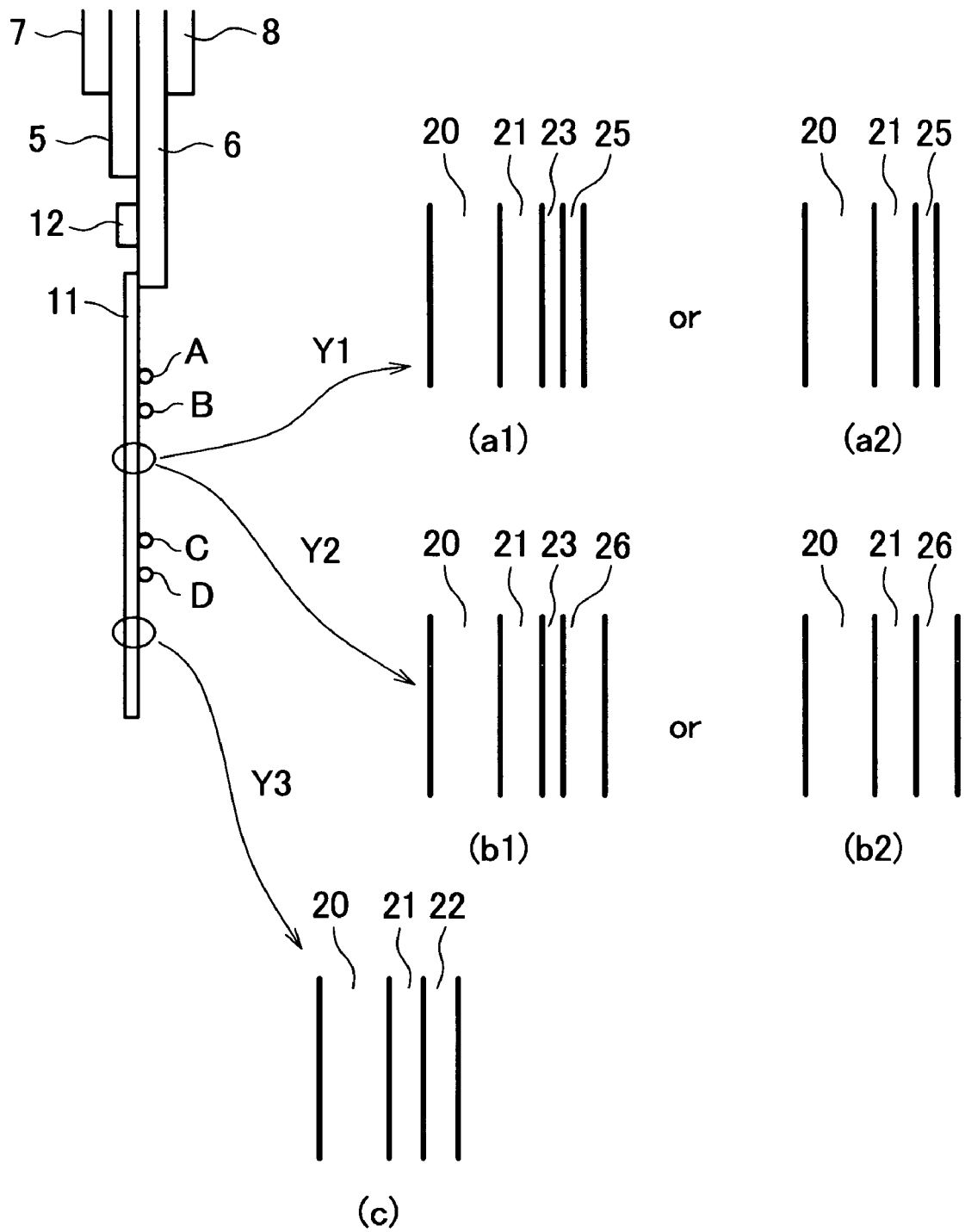
FIG. 4 is a view for explaining the constitution of the exposed portion shown in FIG. 2A and FIG. 2B.

FIG. 4 is a view for explaining the constitution of the exposed portion 13 shown in FIG. 2A and FIG. 2B.

FIG. 4 shows the constitution of a portion (c) indicated by an arrow (Y3), that is, a portion other than the exposed portion of the FPC 11.

The portion (c) is constituted of a base member 20 which is made of a polyimide-based resin, a line layer (copper lines or copper plating lines) 21 formed on the base member, and a surface protective cover 22 which covers the line layer 21. Here, the surface protective cover 22 is formed of a photosensitive resist or is constituted by adhering a polyimide-based film with an adhesive agent. Here, although the explanation is made with respect to portions other than the folded portion in the drawing, the folded portion has the substantially equal constitution.

In FIG. 4, the portions (a1, a2) which are indicated by a narrow (Y1) have the constitutions in which nickel-gold plating or gold plating is formed on the dummy line of the exposed portion 13. In any case, the surface of the exposed portion 13 is covered with gold plating.

The portion (a1) is formed by removing the surface protective cover 22 which covers the line layer 21, and is constituted of the base member 20 made of polyimide-based resin, the line layer (the copper line or the copper plating line) 21 formed on the base member, the nickel plating 23 formed on the line layer, and the gold plating 25 formed on the nickel plating.

The portion (a2) is formed by removing the surface protective cover 22 which covers the line layer 21, and is constituted of the base member 20 made of polyimide resin, the line layer (the copper line or the copper plating line) 21 formed on the base member, and the gold plating 25 formed on the line layer.

In FIG. 4, the portions (b1, b2) which are indicated by an arrow (Y2) have the constitutions in which nickel plating and gold plating or gold plating and solder are formed on the dummy line of the exposed portion 13. In any case, the surface of the exposed portion 13 is covered with solder.

The portion (b1) is also formed by removing the surface protective cover 22 which covers the line layer 21, and is constituted of the base member 20 made of polyimide resin, the line layer (the copper line layer or the copper plating line layer) 21 formed on the base member, nickel plating 23 and the solder 26 formed on the line layer.

The portion (b2) is also formed by removing the surface protective cover 22 which covers the line layer 21, and is constituted of the base member 20 made of polyimide resin, the line layer (the copper line layer or the copper plating line layer) 21 formed on the base member, and the solder 26 formed on the line layer.

Here, in the portions (b1, b2), the gold plating (25) is melted in the soldering step and is diffused in the inside of the solder 26 (remaining as alloy or impurities in the inside of the solder) and hence, the illustration is omitted.

In this manner, according to this embodiment, the dummy line is exposed from the surface protective cover by forming the exposed portions 13, that is, by removing the surface protective cover of the FPC 11 thus forming the gold plating or the soldering on the surfaces of the exposed portions 13 whereby a hard layer is arranged on the folded portion 11a of the FPC 11. Accordingly, it is possible to suppress a bending repulsive force of the folded portion 11a of the FPC 11 thus reducing a manufacturing cost.

Here, any of the structures (a1), (a2), (b1) and (b2) can be arbitrarily adopted.

Here, in the above-mentioned embodiment, the number of exposed portions 13 may be at least one or more. Further, the exposed portions 13 may be formed inside or outside the folded portion 11a of the FPC 11. However, as in the case of this embodiment, the formation of the exposed portions 13 inside the folded portion 11a of the FPC 11 is more advantageous in easily avoiding an electric contact due to the metal exposure.

Figure 5:
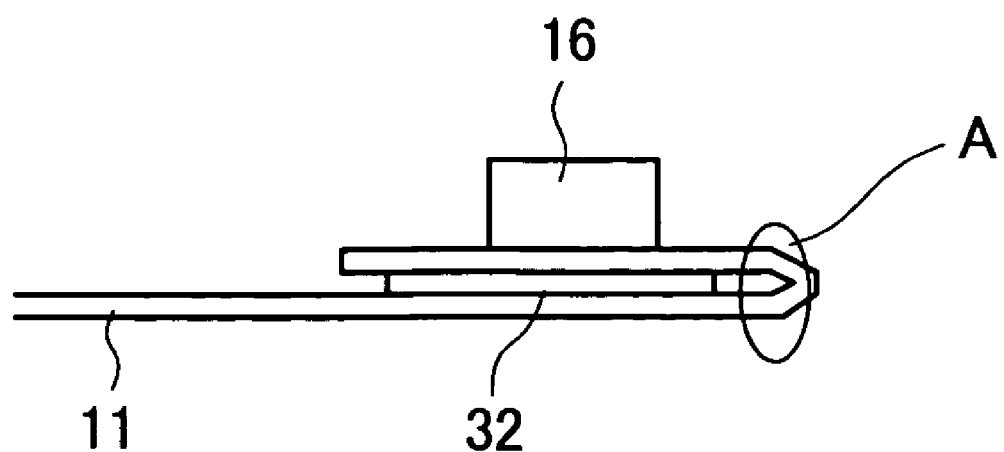
FIG. 5 is a view for explaining a modification of the flexible printed circuit board (FPC) of the embodiment 1 of the invention.

FIG. 5 is a view for explaining a modification of the FPC 11 of the embodiment.

Although the FPC 11 has one end thereof fixed to a terminal portion on the glass substrate 6, the FPC 11 may be folded in the vicinity of another end thereof and may be fixed by a pressure sensitive adhesive double coated tape 32, and an interface connector 16 is provided in front of the folded portion 11a (another end side). Even in such a constitution, by forming the above-mentioned exposed portions 13 at the folded portion 11a indicated by A in FIG. 5, even when the pressure sensitive adhesive double coated tape 32 having a weak adhesive force is used, it is possible to prevent the peeling-off of the FPC 11. Alternatively, the pressure sensitive adhesive double coated tape 32 may be omitted.

Figure 6:
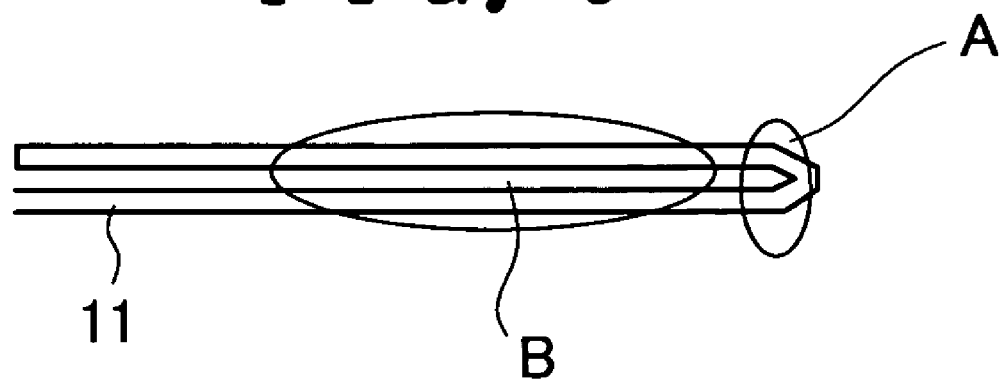
FIG. 6 is a view for explaining a modification of the flexible printed circuit board (FPC) of the embodiment 1 of the invention.

FIG. 6 is a view for explaining a modification of the FPC 11 of the embodiment.

As shown in FIG. 6, when it is necessary to partially fold the FPC 11 and to fix the FPC 11 (to make the returning of the FPC 11 difficult) using the pressure sensitive adhesive double coated tape or the like at the portion B, by forming the above-mentioned exposed portions 13 on the folded portion 11a indicated by A in FIG. 6, it is possible to omit the pressure sensitive adhesive double coated tape which has been necessary for the position B shown in FIG. 6.

Embodiment 2

FIGS. 7A and 7B are views for explaining an FPC 11 of an embodiment 2 of the invention, wherein FIG. 7A is a view as viewed from a side surface and FIG. 7B is a view as viewed from a back surface side (a side opposite to a liquid crystal display panel or a side opposite to a viewer).

In this embodiment, in place of forming the exposed portions 13 by removing the surface protective cover 22 at the folded portion, a metal plate 40 is adhered to the surface protective cover 22. For example, a stainless steel plate may be used as the metal plate 40. Further, the metal plate 40 may be adhered to the surface protective cover 22 using a thermosetting adhesive agent. Here, the dummy line may not be used.

Also in this embodiment, it is possible to reduce a spring back of the FPC 11 due to the plasticity of the metal plate 40.

The position, the size and the shape of the metal plate 40 are substantially equal to the position, the size and the shape of the exposed portions 13 in the embodiment 1. When the metal plate 40 includes a plurality of linear portions which extend in the direction which intersects the folded portion 11a (the longitudinal direction in the drawing), it is preferable that the plurality of linear portions are integrally formed by a connecting portion which connects the plurality of linear portions (extending in the lateral direction in the drawing) For example, a shape such as a window frame shown in FIG. 7 is named as an example.

Further, unlike the embodiment 1, there arises no problem even when the metal plate 40 is adhered to 50% or more of an area of the folded portion 11a or the whole surface of the folded portion 11a.

Here, in the above-mentioned explanations of respective embodiments, the explanation has been made with respect to the embodiments which apply the invention to the liquid crystal display device. However, the invention is not limited to the liquid crystal display device and is applicable to a display device such as an organic EL display device.

Although the inventions made by inventors of the invention have been specifically explained based on the embodiments, it is needless to say that the invention is not limited to the above-mentioned embodiments and various modifications are conceivable without departing from the gist of the invention.

What is claimed is:

1. A display device comprising:
   a display panel; and
   a flexible printed circuit board which has one end thereof connected to a terminal portion of the display panel;
   wherein the flexible printed circuit board includes a base member, a line layer which is formed on the base member using a metal layer, a surface protective cover which covers the line layer, and a folded portion;
   wherein the line layer includes a signal line which supplies control signals or display data to the display panel and a dummy line;
   wherein the signal line is covered with the surface protective cover at the folded portion;
   wherein the folded portion includes at least one exposed portion in which the dummy line is exposed from the surface protective cover ranging from a folding start point to a folding finish point; and
   wherein the total area of the exposed portion at the folded portion assumes 10% or more and 50% or less of an area of the folded portion.

2. A display device comprising:
   a display panel; and
   a flexible printed circuit board which has one end thereof connected to a terminal portion of the display panel;
   wherein the flexible printed circuit board includes a base member, a line layer which is formed on the base member using a metal layer, a surface protective cover which covers the line layer, and a folded portion;
   wherein the line layer includes a signal line which supplies control signals or display data to the display panel and a dummy line;
   wherein the signal line is covered with the surface protective cover at the folded portion;
   the folded portion includes at least one exposed portion in which the dummy line is exposed from the surface protective cover ranging from a folding start point to a folding finish point; and
   wherein gold plating is formed on a surface of the exposed portion.

3. A display device according to claim 2, wherein 90% or more of an area of the signal line at the folded portion is covered with the surface protective cover.

4. A display device according to claim 3, wherein the whole area of the signal line at the folded portion is covered with the surface protective cover.

5. A display device according to claim 2, wherein a shape of at least one exposed portion is arranged in the direction which intersects the folded portion.

6. A display device according to claim 2, wherein the dummy line of the exposed portion assumes an electrically floating state.

7. A display device according to claim 2, wherein a ground potential is supplied to the dummy line of the exposed portion.

8. A display device according to claim 2, wherein the display panel is a liquid crystal display panel, and a backlight is arranged on a back surface side of the liquid crystal display panel, and the flexible printed circuit board is folded at the folded portion and has a portion thereof arranged on the back surface side of the back light.

9. A display device according to claim 8, wherein the back light includes a frame-like mold, and the flexible printed circuit board is adhered to a back surface-side surface of the frame-like mold.

10. A display device according to claim 2, wherein the flexible printed circuit board has another end thereof folded at the folded portion, and has a connector on a side closer to the another end than the folded portion.

11. A display device comprising:

a display panel; and a flexible printed circuit board which has one end thereof connected to a terminal portion of the display panel;

wherein the flexible printed circuit board includes a base member, a line layer which is formed on the base member using a metal layer, a surface protective cover which covers the line layer, and a folded portion;

wherein the line layer includes a signal line which supplies control signals or display data to the display panel and a dummy line;

wherein the signal line is covered with the surface protective cover at the folded portion;

wherein the folded portion includes at least one exposed portion in which the dummy line is exposed from the surface protective cover ranging from a folding start point to a folding finish point; and wherein solder is formed on a surface of the exposed portion.

12. A display device comprising:

a display panel; and a flexible printed circuit board which has one end thereof connected to a terminal portion of the display panel;

wherein the flexible printed circuit board includes a base member, a line layer which is formed on the base member using a metal layer, a surface protective cover which covers the line layer, and a folded portion;

wherein the line layer includes a signal line which supplies control signals or display data to the display panel and a dummy line;

wherein the signal line is covered with the surface protective cover at the folded portion;

wherein the folded portion includes at least one exposed portion in which the dummy line is exposed from the surface protective cover ranging from a folding start point to a folding finish point; and wherein a distance between a start point of the at least one exposed portion and the folding start point of the folded portion or a distance between a finish point of the at least one exposed portion and the folding finish point of the folded portion is set to 0.5 mm or more.

* * * * *